United States Patent
Andrews et al.

(10) Patent No.: US 6,486,705 B2
(45) Date of Patent: Nov. 26, 2002

(54) SIGNAL DISTRIBUTION SCHEME IN FIELD PROGRAMMABLE GATE ARRAY (FPGA) OR FIELD PROGRAMMABLE SYSTEM CHIP (FPSC) INCLUDING CYCLE STEALING UNITS

(75) Inventors: William B. Andrews, Long Pond, PA (US); Alfred E. Dunlop, Murray Hill, NJ (US); John P. Fishburn, Murray Hill, NJ (US); Harold N. Scholz, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/864,276

(22) Filed: May 25, 2001

(65) Prior Publication Data

US 2002/0003445 A1 Jan. 10, 2002

Related U.S. Application Data

(60) Provisional application No. 60/207,371, filed on May 26, 2000.

(51) Int. Cl.[7] .............................................. H03K 19/00
(52) U.S. Cl. .............................. 326/93; 326/40; 326/46
(58) Field of Search ......................... 326/37–41, 93–98, 326/46

(56) References Cited

U.S. PATENT DOCUMENTS

| 5,455,931 A | * | 10/1995 | Camporese et al. | ........ 713/501 |
| 5,790,838 A | * | 8/1998 | Irish et al. | .................. 713/500 |
| 6,255,848 B1 | * | 7/2001 | Schultz et al. | ................. 326/38 |

* cited by examiner

Primary Examiner—Don Phu Le

(57) ABSTRACT

Fractional cycle stealing units are introduced in the routing of a programmable device such as an FPGA or FPSC to increase system performance resulting from the particular clock routing. The disclosed fractional cycle stealing units enable given amounts of clock skew between individual distribution sinks, and/or between logic paths that are in series. Each of the delay elements 'steals' a portion of a clock cycle (and perhaps one or more full clock cycles) from subsequent circuits to provide a more reliable logical function, and to avoid the need for overall additional clock cycles. These fractional cycle stealing elements offer a signal skew adjustment at the sinks of the distribution with no additional routing congestion expense. The disclosed cycle stealing delay elements are programmable, and enable clock skew between individual distribution sinks.

9 Claims, 4 Drawing Sheets

SIGNAL DISTRIBUTION SCHEME IN FIELD PROGRAMMABLE GATE ARRAY (FPGA) OR FIELD PROGRAMMABLE SYSTEM CHIP (FPSC) INCLUDING CYCLE STEALING UNITS

This application claims priority from U.S. Provisional Application No. 60/207,371 entitled "Novel Field Programmable Gate Array" filed on May 26, 2000, the specification of which is hereby expressly incorporated herein by reference.

BACKGROUND OF THE INVENTION

1. Field of the Invention

This invention relates generally to field programmable gate arrays (FPGAs). In particular, it relates to the implementation of improved architectures and functions within an FPGA.

2. Background of Related Art

A Field Programmable Gate Array (FPGA) is a programmable integrated circuit which provides a customized logic array and functionality to a particular customer.

FIG. 4 depicts a conventional Field Programmable Gate Array (FPGA).

In particular, as shown in FIG. 4, an FPGA 400 typically includes four distinct features: configuration memory 406, input/output (I/O) blocks 408–414, configurable logic blocks 404, and a routing network 402 between the internal components.

Configuration memory 406 provides access between the elements of the FPGA 400 and one external controlling device (e.g., a programmer). Based on the contents of the configuration memory 406, various logical functions of the configurable logic blocks 404 are enabled and wired together via a configuration of the routing network 402. Similarly, certain logic blocks are provided I/O access through various types of I/O devices 408–414, as determined by both the configuration memory 406 and the routing provided by the routing network 402.

The configuration memory 406 may be, e.g., static RAM (SRAM). The configuration memory bits turn elements or switches on or off in embedded elements of the configurable logic blocks 404, and establish routing between elements of the FPGA 400, to define the functionality of the FPGA 400.

Typically, individual memory bits of the configuration memory 406 define the desired functionality of the FPGA device 400. These configuration memory bits are conventionally loaded one at a time using data lines and address lines directly to the configuration memory 406 (e.g., SRAM) over an external bus 420 from an external source. All embedded elements are programmed similarly using the same format to the configuration memory 406.

Other types of configuration memory 406 typically include, e.g., EPROM or EEPROM, anti-fused, fused, or other storage devices, providing either one-time programmability, or multiple reprogrammability. The configuration memory 406 may be formed of one or more types of memory (e.g., SRAM and EEPROM).

The I/O blocks 408–414 conventionally provide direct connection between an internal, embedded component of the FPGA 400, and external devices. The I/O blocks 408–414 may be hard-wired and/or configured and routed based on the user-instructed configuration stored in the configuration memory 406.

The configuration memory 406 is loaded, or programmed, before use of the FPGA 400. Before the FPGA 400 is configured, no external devices other than the single programming device connected to the external access bus 420 are permitted to communicate with embedded elements of the FPGA 400 (e.g., with the configurable logic blocks 404).

The routing network 402 is programmably defined by the configuration memory 406 to route signaling between the internal logic blocks of the FPGA. The routing network 402 carries signal traffic between the various internal, embedded components of the FPGA 400. Some portions of the routing network 402 may be directly connected or hard wired and/or may not be fully programmable by the user.

FPGA devices often include embedded run-time memory 450 in addition to the configuration memory 406. The embedded run-time memory 450 is accessible until configuration of the FPGA 400 is complete. Moreover, the configuration memory 406 is generally not reprogrammed while the FPGA device 400 is in operation.

FPGA devices 400 are typically programmed using an appropriate configuration and routing software application which inputs a user's particular requirements, and determines a best configuration of the routing of the FPGA 400 by steps generally referred to as "partitioning", "placing", and "routing", to ultimately configure the elements of the FPGA 400 to meet the particular user's needs.

FPSCs, a more recent derivation of an FPGA, combines field programmable logic with ASIC or mask programmed logic into a single device. FPSCs provide the quick time to market and flexibility inherent in FPGAs, the design effort savings inherent from the use of software driven cores, as well as the speed, design density, and economy inherent in application specific integrated circuits (ASICs).

Embedded cores within an FPSC can take many forms. Generally, the embedded cores available within an FPSC are selected from an ASIC library, but customer specific FPSCs may be developed to include one or more custom, proprietary or otherwise unique embedded core supplied by the user.

The present invention relates generally to the way that an FPGA or FPCS dedicated signal distribution network distributes a signal from a source to the sinks of a network.

Each sink of a signal distribution network has a delay from its source. Different sinks in a distribution network may have different delays. Conventional FPGAs and FPSCs adjust individual sink timing in a signal distribution network using undedicated and slow routing resources, causing increased distributed signal injection time, an increase in routing congestion, and extreme sensitivity to system timing.

When the distribution network is formed, there is a fixed time relationship between the different sinks. In a synchronous system, this fixed time relationship restricts performance of the system when the sinks of a signal distribution are flip-flops and the distributed signal is a clock. In accordance with the invention, if any logical path between any two sink flip-flops is longer than the period of the clock signal being distributed, longer logic paths are given more time to meet system requirements without impacting the period of the distributed clock signal and therefore, overall system performance.

As system input/output (I/O) timing requirements increase, it becomes more difficult to meet I/O setup times, hold times, and clock-to out times. Systems using an early distributed clock signal achieve faster I/O clock-to-out times at the expense of I/O input setup time. This setup time expense is reduced or removed by the introduction of the clock delay to the I/O input flip-flops.

There is a need for a signal distribution scheme in an FPGA or FPSC which supports a fast, programmable network distribution scheme.

SUMMARY OF THE INVENTION

In accordance with the principles of the present invention, a distribution network in a programmable device comprises a routing network, and a fractional cycle stealing delay unit associated with at least one route in the routing network. The fractional cycle stealing delay unit introduces a selected delay between embedded elements in the programmable device.

A method of increasing speed through a distribution network of a programmable device in accordance with another aspect of the present invention comprises selecting a desired delay to an embedded element in the programmable device. A delay tap corresponding to the selected desired delay is routed into the embedded element.

A field programmable gate array in accordance with yet another aspect comprises a plurality of cells, and a clock distribution clocking the plurality of cells. The clock distribution includes a cycle stealing unit adapted to enable clock skewing between series paths.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Figure 1:
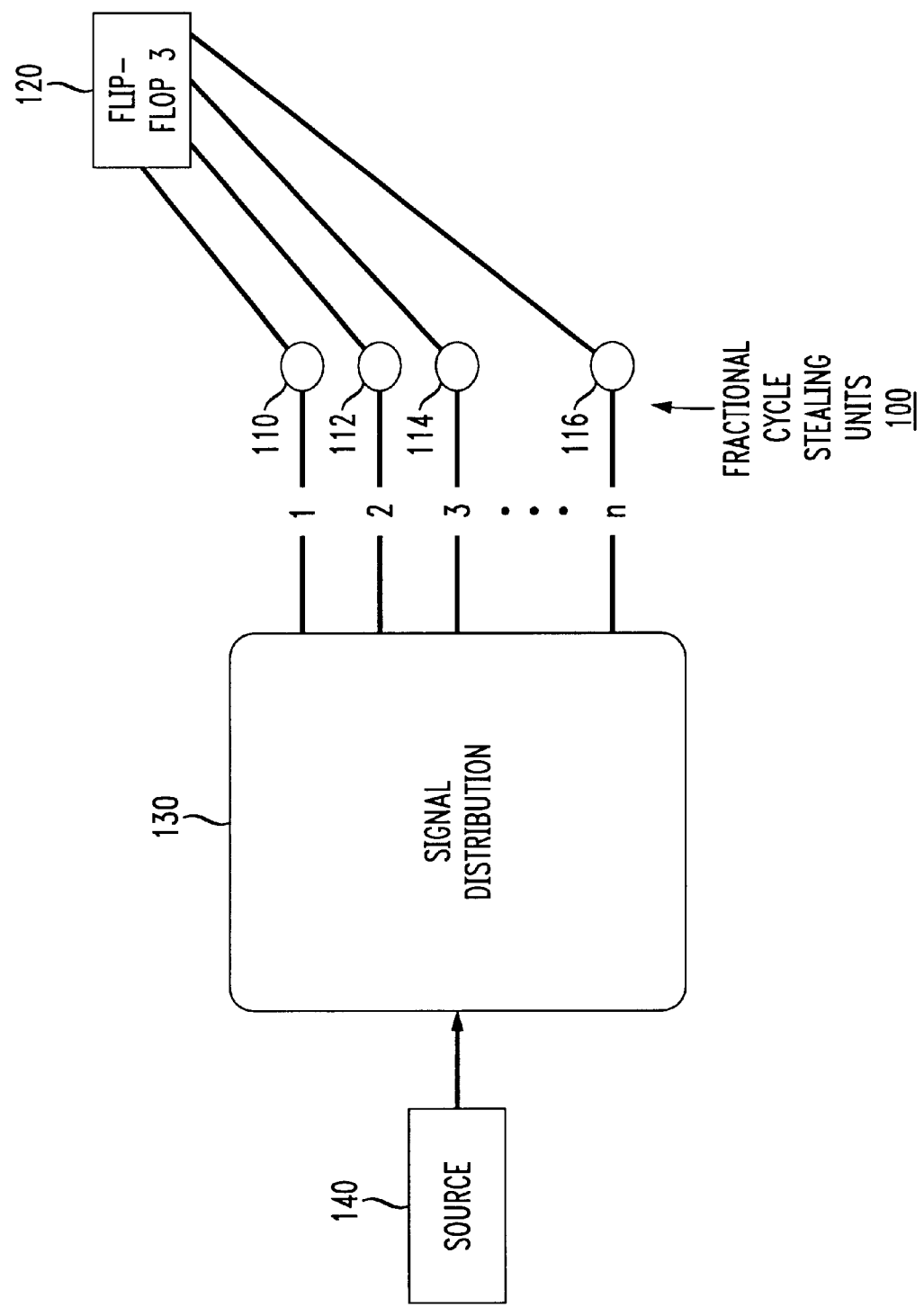
FIG. 1 shows a top level view of a fractional cycle stealing delay unit in an exemplary signal distribution network of an FPGA or FPSC, in accordance with the principles of the present invention.

A fixed time relationship exists between different sinks in a distribution network, which restricts system performance when signals are stored in flip-flops. If any logical path between any two sink flip-flops is longer than the period of the signal being distributed, the logical path will not meet the system timing requirements. As a result of the introduction of programmable delays stages to the sinks of a distribution network in an FPGA or FPSC, longer logic paths are given more time to meet system requirements without impacting the period of the distributed signal, and therefore overall system performance is significantly enhanced.

In accordance with the principles of the present invention, cycle stealing units are introduced in the routing of a programmable device such as an FPGA or FPSC to increase system performance resulting from the particular clock routing. The disclosed fractional cycle stealing units enable given amounts of clock skew between individual distribution sinks, and/or between logic paths that are in series.

The present invention provides a signal distribution network within an FPGA or FPSC including programmable delay elements at each of the distribution sinks in an FPGA or FPSC. Each of the delay elements 'steals' a fraction of a clock cycle (or one or more full clock cycles and/or a fraction of another clock cycle) from subsequent circuits to provide a more reliable logical function, and to avoid the need for overall additional clock cycles. These fractional cycle stealing elements offer a signal skew adjustment at the sinks of the distribution with no additional routing congestion expense. The disclosed cycle stealing delay elements are programmable, and enable clock skew between individual distribution sinks. The unique signal distribution scheme has particular application in a Field Programmable Gate Array (FPGA) or Field Programmable System Chip (FPSC), Cycle stealing (i.e., intentional skewing of the clock signal) enables the introduction of discrete values of skew between embedded sinks, and provides a signal distribution network with a programmable sink delay element for clock skew control. Individual sink cycle stealing delay elements allow the sinks of a distribution network in an FPGA or FPSC to be individually skewed in delay with respect to one another, increasing both the system performance and the overall system performance, thereby making the system performance objectives more attainable. In accordance with the principles of the present invention, system performance and speed is increased by the inclusion of fractional cycle delays, avoiding the need for extra overhead routing adding to the routing congestion.

The cycle stealing delay elements reduce I/O input flip-flop setup time by allowing adjustment of I/O setup times, without impacting I/O clock-to-out performance. Moreover, signals can be routed and sink skew can be adjusted without impacting signal distribution injection delay.

An FPGA or FPSC comprises programmable blocks and programmable routing resources. The routing resources allow for routing between the different blocks of the FPGA or FPSC. There are typically different types of routing resources available, one of them being distribution routing resources for clock signals, and another being for distribution of data signals.

System performance and the period of a clock signal are often limited by the clock distribution routing scheme. It is a goal of FPGA and FPSC clock routing resources to minimize clock skew as FPGA and FPSC architecture progresses toward larger and larger gate counts. In accordance with the disclosed embodiments, cycle stealing delay elements may be utilized in a clock line to skew a clock signal, in a data line to skew a data signal, or in both the clock line and the data line (e.g., of a flip-flop) to skew both a clock signal and a data signal.

FIG. 1 shows a top level view of a fractional cycle stealing delay unit in an exemplary signal distribution network of an FPGA or FPSC, in accordance with the principles of the present invention.

In particular, as shown in FIG. 1, a clock or data signal starts at a source 140, is routed by a signal distribution network 130 in a programmable device such as an FPGA or FPSC, and is passed through a programmably selected fractional cycle stealing delay stage 110–116 (also collectively referred to as fractional cycle stealing units 100). The cycle stealing units 100 are implemented for use ideally before flip-flops 120 in an FPGA array to allow programmable control of clock skew to each flip-flop 120 when necessary.

In the disclosed embodiments, the fractional cycle stealing units 100 are programmable, with each providing a different, predictable skew adjustment. In the given examples, the fractional cycle stealing units 100 provide a delay of, e.g., between 0 and 2 nanoseconds.

The use of a fractional cycle stealing unit 100 'steals' a fraction of a cycle, or one or more clock cycles plus a fraction of another, from a subsequent element, and uses it in the previous element. In this way, time can be stretched to a first flip-flop (i.e., giving a longer delay), in a way penalizing a subsequent flip-flop. However, the Applicants recognized that the weakest speed links in many FPGA or FPSC distribution networks is found in the first flip-flops, whereas the later flip-flops in a series circuit have some time to spare. The present invention takes advantage of the available cycle time in later flip-flops and 'gives' the extra time to the earlier flip-flops in the circuit. Ultimately, the goal is to catch up in time, and in fact 5% to 20% improvements in speed have been attained using fractional cycle stealing delay units in accordance with the principles of the present invention.

Figure 2:
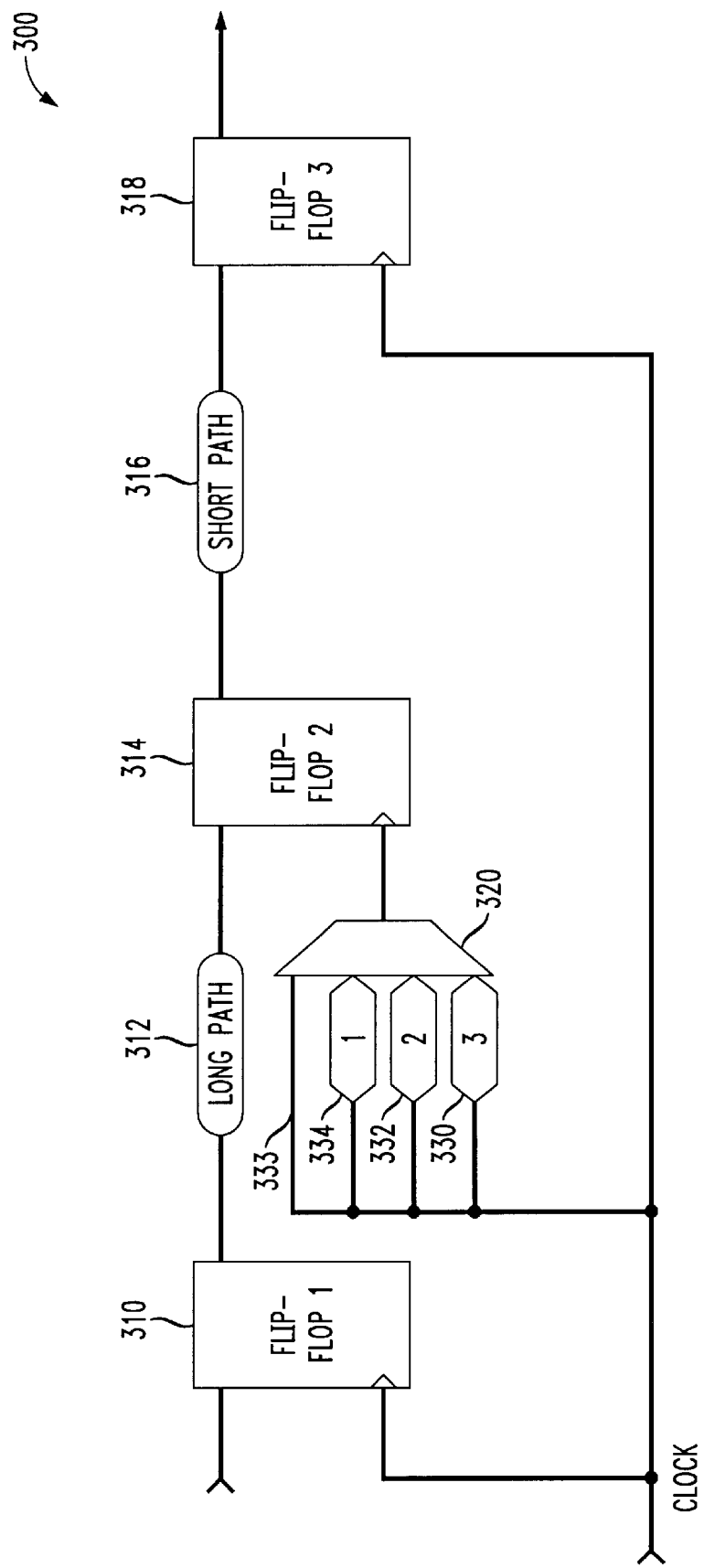
FIG. 2 shows two paths in series, where the upstream path is longer than the downstream path, with a parallel path utilizing a programmable fractional cycle stealing delay unit, in accordance with the principles of the present invention.

FIG. 2 shows two data signal paths in series, where the upstream path is longer than the downstream path, with a parallel clock signal path utilizing a programmable fractional cycle stealing delay unit, in accordance with the principles of the present invention.

In particular, as shown in FIG. 2, a first flip-flop 310 provides a signal to a second flip-flop 314 using a relatively long path 312 (e.g., 11 nS), whereas the clock signal to the second flip-flop 314 may take a relatively short path. Thus, in accordance with the principles of the present invention, a programmable selection is made between various possible fractional cycle stealing delay units 330–334, selected and enabled by a suitable multiplexer 320, and input to the clock input of the second flip-flop 314. The second flip-flop provides a signal to a third flip-flop 318 taking a relatively short path 316 (e.g., 7 nS).

By way of example, FIG. 2 shows an example of two paths in series in an FPGA, where the upstream path requires 11 nS (long path 312) and the downstream path requires 7 nS (short path 316). If the cycle period target is, e.g., 10 nS (100 MHz), then the simple delay of the clock signal input to the second flip-flop 314 using a selected one of the fractional cycle stealing delay units 330–334 will allow 1 nS of margin during 100 MHz operation.

However, in accordance with the principles of the present invention, use of a fractional cycle stealing delay unit 330–334 before the second flip-flop 314 at the receiving end of the long path 312 increases the overall timing of the FPGA or FPSC device by eliminating a race condition at the second flip-flop 314.

In FIG. 2, a programmable delay may be selected during configuration from the possibilities of a zero delay element 333 (i.e., a straight through path), a 0.6 nS fractional cycle stealing delay unit 334, a 1.2 nS fractional cycle stealing delay unit 332, and a 2.0 nS fractional cycle stealing delay unit 330. Note that these delay values are entirely by way of example only. Longer or slower delays may be implemented, and/or more delay units may be implemented, all within the scope of the present invention.

The fractional cycle stealing delay units 100 may be formed of any suitable delay elements, e.g., by adding capacitance to a particular line, by making a longer channel gate length to make a particular inverter more sluggish, etc. The fractional cycle stealing delay units 100 shown in FIG. 2 are formed from purposely sluggish inverters.

Preferably, the particular delay is selected and programmed during configuration of the particular programmable device, e.g., the FPGA or FPSC.

Each flip-flop may have its own cycle stealing multiplexer 320 associated therewith. In the example shown in FIG. 2, a 4 to 1 multiplexer 320 is implemented to allow programmable selection of an available fractional cycle stealing delay unit 334-330 under the control of field programming bits. Thus, multiplexer 320 allows the flip-flop 314 to pick up either an undelayed CLOCK signal, a 0.6 nS delayed clock signal Clock D1, a 1.2 nS delayed clock signal Clock D2, or a 2.0 nS delayed clock signal Clock D3.

In a given example, presume that the appropriate fractional cycle stealing delay unit 334–330 is selected to delay the clock signal input to the flip-flop 314 by a desired amount X. As a result, X amount of time is stolen from a short path 316 and given to the long path 312. The minimum clock period at which the long path 312 will operate properly is thus reduced by X, enabling it to meet stringent system requirements.

Figure 3:
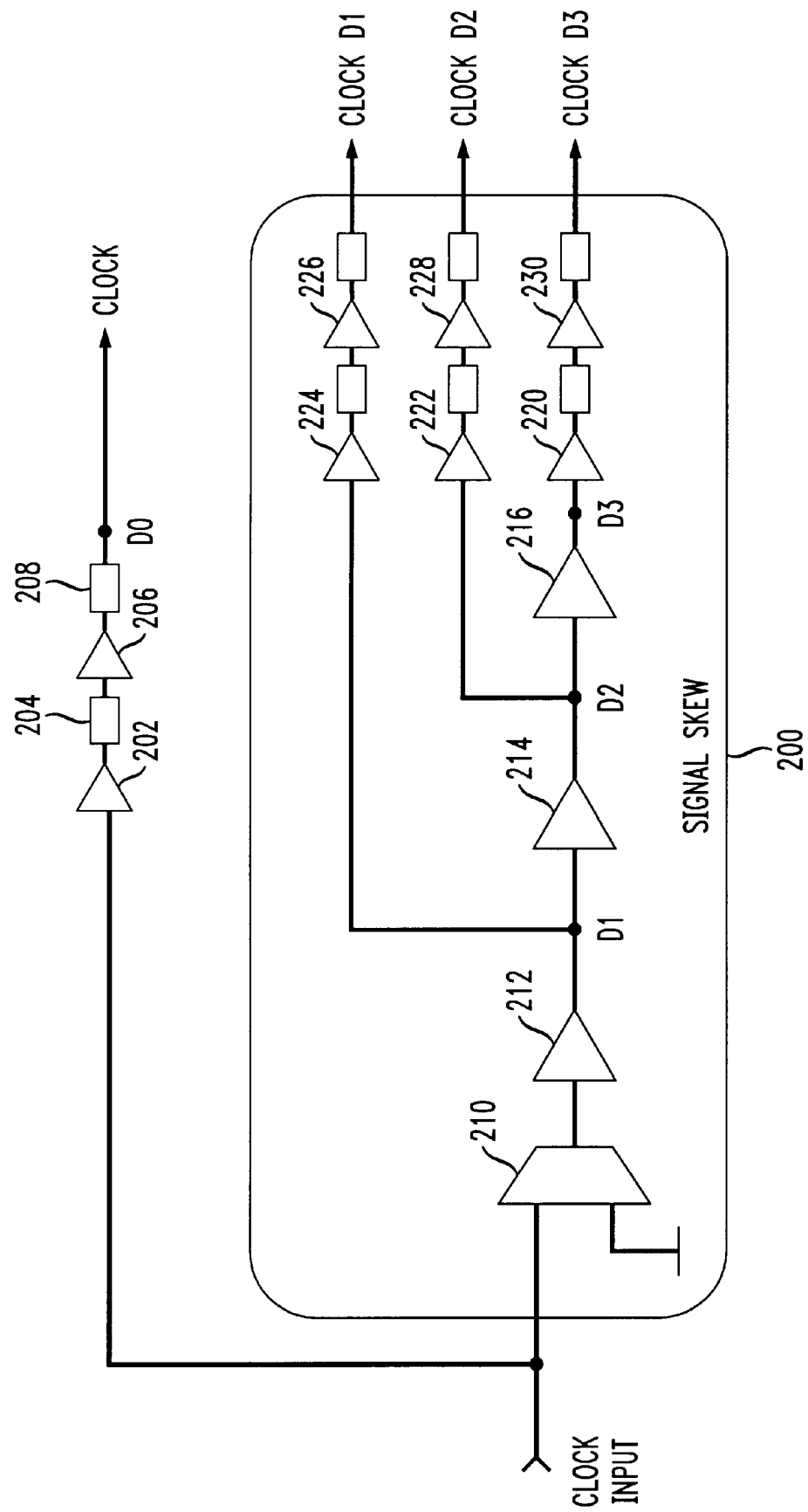
FIG. 3 shows an exemplary clock delay scheme provided by fractional cycle stealing delay units for a particular signal, in accordance with the principles of the present invention.
Figure 4:
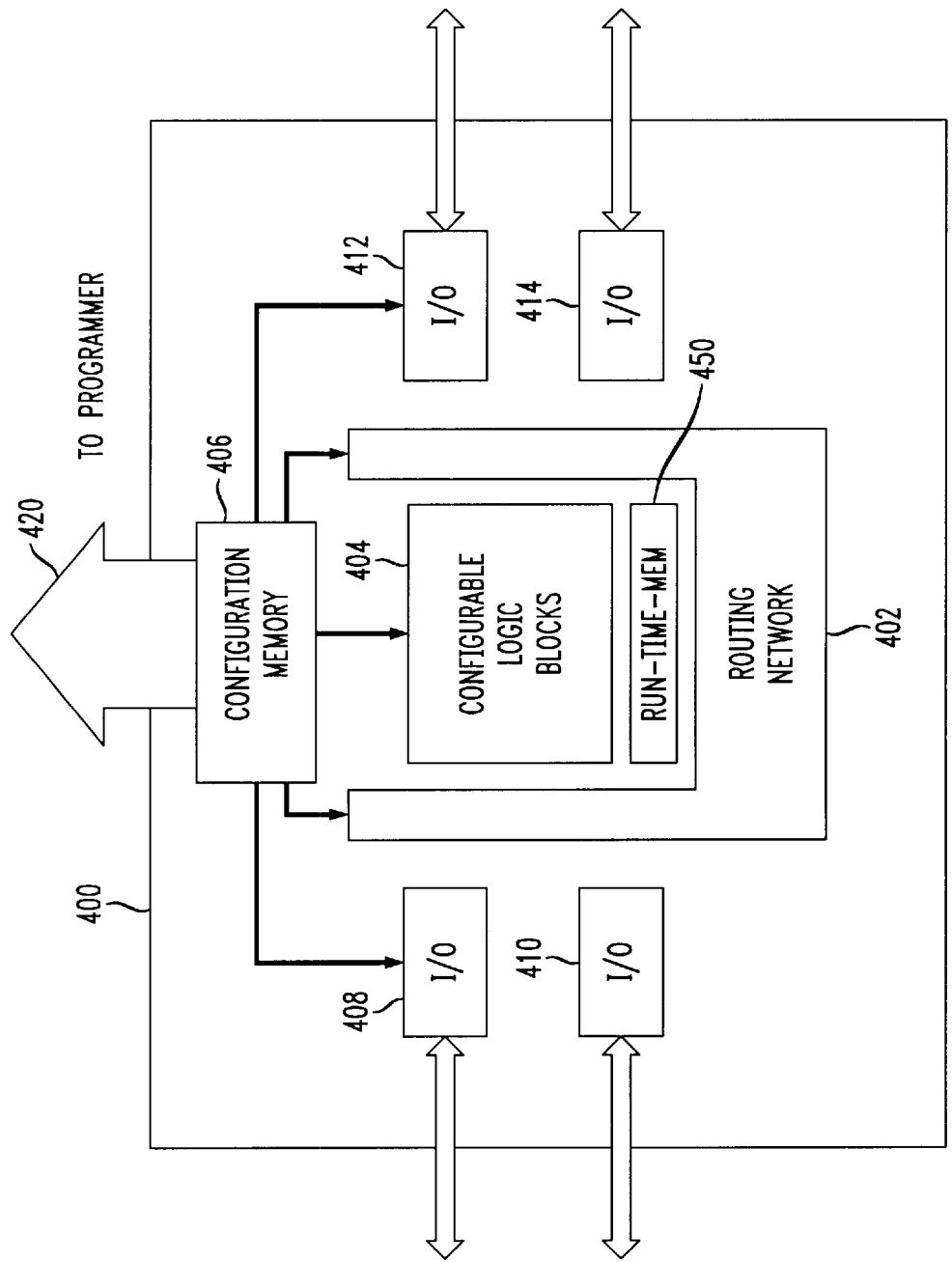
FIG. 4 shows a conventional Field Programmable Gate Array (FPGA).

FIG. 3 shows an exemplary clock delay scheme provided by fractional cycle stealing delay units 100 for a particular signal, in accordance with the principles of the present invention.

In particular, as shown in FIG. 3, the clock input signal is a clock signal for a given number of flip-flops in a cell of an FPGA or FPSC, before programmable delay. The fractional cycle stealing delay units 100 include multiple delay taps (e.g., D1, D2, D3), as well as an undelayed (but perhaps buffered) tap D0. The clock signal passed through the various delay taps (Clock D1, Clock D2, Clock D3) and the undelayed clock signal CLOCK provide, e.g., three different delay increments capable of being used by an individual flip-flop at a receiving end (e.g., flip-flop 314 in FIG. 2).

To save power when not in use, the programmable clock delay may be tied off (e.g., using an enable input to the multiplexer 210) when not in use. Similarly, certain unused taps of a fractional clock stealing delay unit may be turned while the delay taps which are used are enabled, to save power to the unused delay taps. However, additional per-delay tap control will come at the expense of additional memory cell resources to configure such control.

While the exemplary embodiment shown in FIG. 3 implements three different delay increments, the principles of the invention relate equally to any plurality of different delay increments suitable to the particular application.

Moreover, while FIG. 3 shows an exemplary cycle stealing scheme used to implement a clock delay scheme, the principles are equally applicable to any type of input signal within an FPGA or FPSC.

While the invention has been described with reference to the exemplary embodiments thereof, those skilled in the art will be able to make various modifications to the described embodiments of the invention without departing from the true spirit and scope of the invention.

What is claimed is:

1. A distribution network in a programmable device, comprising:
    a routing network operable to route a signal from a signal source to an embedded element in said programmable device; and
    a fractional cycle stealing delay stage associated with a route in said routing network, said fractional cycle stealing delay stage including a plurality of fractional cycle stealing units each providing a different signal delay, said stage being programmable to select among said fractional cycle stealing units and thereby introduce a selected delay into said signal between said signal source and said embedded element.

2. The distribution network in a programmable device according to claim 1, wherein said embedded element is a flip-flop.

3. The distribution network in a programmable device according to claim 1, wherein the signal source is a clock.

4. The distribution network in a programmable device according to claim 1, wherein:

each different delay is less than a full cycle of said signal being passed therethrough.

5. The distribution network in a programmable device according to claim 1, wherein:

said programmable device is an FPGA.

6. The distribution network in a programmable device according to claim 1, wherein:

said programmable device is an FPSC.

7. The distribution network in a programmable device according to claim 1, wherein said fractional cycle stealing stage comprises a plurality of fractional cycle stealing units each coupled to an input terminal of a programmable multiplexer.

8. The distribution network in a programmable device according to claim 1, wherein each of said fractional cycle stealing units comprises a series of inverters and buffers.

9. The distribution network in a programmable device according to claim 1, wherein each of said fractional cycle stealing units comprises a tap.

* * * * *